_United States Patent_ [19]

Keramidas

[11] 4,081,824
[45] Mar. 28, 1978

[54] OHMIC CONTACT TO ALUMINUM-CONTAINING COMPOUND SEMICONDUCTORS

[75] Inventor: Vassilis George Keramidas, Warren, N.J.

[73] Assignee: Bell Telephone Laboratories, Incorporated, Murray Hill, N.J.

[21] Appl. No.: 780,977

[22] Filed: Mar. 24, 1977

[51] Int. Cl.$^2$ .................... H01L 23/48; B01J 17/00
[52] U.S. Cl. ........................................ 357/67; 29/590; 357/17; 357/71
[58] Field of Search ................ 29/589, 590; 148/185; 357/17, 67, 71

[56] References Cited

U.S. PATENT DOCUMENTS

| | | | |
|---|---|---|---|
| 3,406,050 | 10/1968 | Shortes | 148/185 |
| 3,620,837 | 11/1971 | Leff | 29/589 |
| 3,767,482 | 10/1973 | Kock | 357/67 |
| 3,863,334 | 2/1975 | Coleman | 357/67 |
| 3,942,243 | 3/1976 | Murray | 29/590 |
| 3,942,244 | 3/1976 | Flohrs | 29/590 |

OTHER PUBLICATIONS

Rideout, Ohmic Control Technique for N-Type GaAs, GaAsP and GaAlAs, IBM Technical Disclosure Bulletin, vol. 16, No. 9, p. 3070, Feb. 1974.

_Primary Examiner_—Roy Lake
_Assistant Examiner_—Mark S. Bicks
_Attorney, Agent, or Firm_—Allen N. Friedman

[57] ABSTRACT

A consistently low resistance ohmic contact is made to an aluminum-containing compound semiconductor by a multilayer deposition and heat treatment process. The process includes the deposition of a transition layer on the semiconductor surface to be contacted and an overlying gold layer to provide external contact. The transition layer consists of aluminum and a shallow dopant element which may be deposited as successive layers or together. After the transition layer and the gold overlay are deposited, the composite is raised to a temperature at which the transition layer is liquid. In cases in which the gold-dopant binary system has a polyphase region, it is preferable to select the thickness of the gold layer such that the gold-dopant alloy is in the solid solution region of the phase diagram of that binary system, to prevent enhanced diffusion to the upper gold surface along grain boundaries. In an exemplary realization, an Al-Sn layer was used to contact n-type GaAlAs.

8 Claims, 3 Drawing Figures

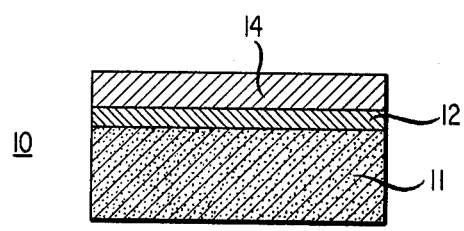
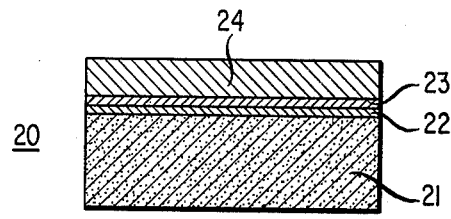
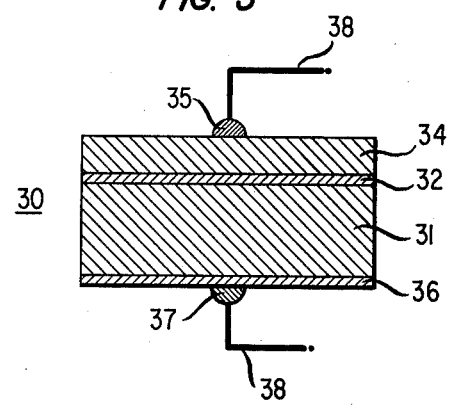

OHMIC CONTACT TO ALUMINUM-CONTAINING COMPOUND SEMICONDUCTORS

BACKGROUND OF THE INVENTION

1. Field of the Invention

The invention is in the field of semiconductor device processing and the devices made thereby. In particular, it relates to providing external electrical contact to compound semiconductors.

2. Decription of the Prior Art

Many multilayer processes for the production of ohmic contact to compound semiconductors are known in the literature. For example, U.S. Pat. No. 3,890,699, issued June 24, 1975 teaches the use of successive layers of gold, silver, and germanium and the subsequent melting of the three layers to produce ohmic contact to N-type gallium arsenide. U.S. Pat. No. 3,850,688, issued Nov. 26, 1974, teaches the deposition of a combination layer of gold and a Group II metallic element over a gold layer to produce ohmic contact to a p-type Group III-V compound semiconductor. Other workers have used epitaxially deposited transition layers (e.g. U.S. Pat. No. 3,914,785, issued Oct. 21, 1975). The literature, however, recognizes the difficulty of contacting aluminum containing compound semiconductors (see, for example, *Solid State Electronics*, 18 (1975)541 at 549) and suggests the use of a relatively expensive epitaxial deposition process.

SUMMARY OF THE INVENTION

The herein disclosed process for making ohmic contact to p-type or n-type aluminum containing compound semiconductors includes the deposition of a layer consisting of aluminum and a shallow dopant element, on the semiconductor area to be contacted. A layer of gold is deposited over the aluminum-dopant transition layer and the composite structure is raised to a temperature at which the layer is liquid but below the temperature at which the gold melts. This heat treatment is performed in a nonoxidizing atmosphere and it results in the attainment of ohmic contact to the compound semiconductor. The dopant element should be selected to produce a shallow donor level in n-type materials or a shallow acceptor level in p-type materials. In many compound semiconductors tin, germanium, and silicon are shallow donors and beryllium and zinc are shallow acceptors. In cases in which the gold-dopant binary system has a polyphase region (e.g. tin-gold), it is preferable to provide a sufficiently thick gold layer such that the gold-dopant binary is in the solid solution region of its phase diagram. This avoids the enhanced diffusion of substrate or transition layer elements to the upper gold surface, which may take place along grain boundaries. Using this method exemplary contacts to n-type gallium aluminum arsenide have been produced using an aluminum-tin transition layer.

BRIEF DESCRIPTION OF THE DRAWING

FIG. 1 is an elevational view in section showing an exemplary semiconductor device for processing in accordance with the inventive method;

FIG. 2 is a second exemplary semiconductor device for processing in accordance with the inventive method; and FIG. 3 is an exemplary semiconductor device including external contacts.

DETAILED DESCRIPTION

It has, in the past, been difficult to reproducibly and consistently make ohmic contact to aluminum containing compound semiconductors. Aluminum is an exceedingly reactive material. Thus, strongly bound oxides and other compounds quickly form on the surface of such aluminum containing materials. These compounds often interfere with attempts to provide ohmic contact to the underlying material. In the present process a transition layer is deposited on the surface of the semiconductor material prior to the deposition of an overlying gold contact layer. The transition layer consists of aluminum and a shallow dopant element. The composite is then heat treated at a temperature above the melting temperature of the transition layer but below the melting temperature of gold. This heat treatment takes place in a nonoxidizing (i.e., inert or reducing) atmosphere. It is believed that this process aids in the production of reproducible ohmic contact to aluminum containing materials by providing chemically active aluminum in the liquid transition layer. This aluminum competes for the oxygen and other elements bound to the surface aluminum and removes enough of this contamination from the surface to permit the dopant element to interact with the semiconductor material and produce ohmic contact. The dopant element operates in a well known manner which includes some diffusion of the dopant element into the surface of the semiconductor to produce shallow donor or acceptor levels. This high concentration of shallow donor or acceptor levels produces the ohmic contact to the semiconductor material. The still solid gold layer holds the liquid layer in place at the semiconductor surface.

The transition layer may be deposited by such processes as evaporation or sputtering. The aluminum and the dopant element are deposited as successive layers or together as a single layer. It is preferable that the aluminum and dopant element be deposited as successive layers with the aluminum being deposited first in direct contact with the aluminum containing compound semiconductor material. FIG. 1 shows a semiconductor device 10 which includes a body 11 of an aluminum containing compound semiconductor with a transition layer 12 including both the aluminum and the dopant element, and an overlying gold layer 14 for the provision of contact to the external circuitry. Of course in the finished device some provision must also be made for the contacting of the lower surface of the semiconductor body 11. This second contact may be an ohmic contact or a rectifying contact as desired. In FIG. 2 the transition layer includes successive layers 22, 23 of aluminum and the dopant element between the semiconductor 21 and the overlying gold layer 24. In cases in which the gold-dopant binary system has a polyphase region (e.g., tin-gold), it is preferable to provide a sufficiently thick gold layer that the gold-dopant binary is in the solid solution region of its binary phase diagram. This tends to prevent accelerated diffusion of substrate or transition layer elements to the upper gold surface along grain boundaries which might otherwise form. Such substances would tend to interfere with subsequent bonding operations. FIG. 3 shows a device in which external contact has been provided by means of a layer 36 on the opposite face of the semiconductor 31 and wires 38 bonded to the contact layers 34, 36 by a bonding agent 35, 37.

For the beneficial use of the multilayer process described above, it is only necessary that the surface layer at least one micrometer thick consist primarily of the aluminum containing compound semiconductor. This layer may also contain minor amounts of dopent elements to produce the desired device electrical properties. The semiconductor device scientist is also aware of the possible diffusion of elements from the transition layer into the compound semiconductor and will incorporate this factor into his device design considerations. The presence in the semiconductor surface layer of any significant (significant from a device performance point of view) contributes to the difficulty of making ohmic contact in the absence of the above disclosed multilayer process. Contacts to $Ga_{1-x}Al_xAs$, with as little as $x = 0.1$ showed significant improvement through the use of this process.

Exemplary Material Systems

Aluminum containing compound semiconductors which may be contacted by the herein disclosed method include the Group III-V compound semiconductors aluminum phosphide, aluminum arsenide, and aluminum antimonide. Applicable ternary materials include gallium aluminum arsenide, gallium aluinum phosphide, gallium aluminum antimonide, and indium aluminum arsenide. Quaternary materials include gallium aluminum indium arsenide. Other applicable materials include the Group I-III-VI compound semiconductors.

Shallow dopant materials for use in this process should provide acceptor levels for contact to p-type semiconductors or donor levels for contact to n-type semiconductors with less than approximately one-quarter volt ionization energy, for device operation n the neighborhood of room temperature. Higher operating temperatures permit the use of somewhat higher ionization energies. Operation at significantly lower temperatures requires the use of dopants with lower ionization energies. For most of the above-mentioned semiconductors, silicon, germanium, and tin are shallow donor dopants and beryllium, and zinc are shallow acceptor dopants.

EXAMPLES

An aluminum-tin transition layer has been used to produce ohmic contact to n-type gallium aluminum arsenide doped with silicon and tellurium. In this process a suitably cleaned wafer was evaporation coated with a 30 Angstrom layer of aluminum followed by a 500 Angstrom layer of tin and a 30,000 Angstrom layer of gold. The composite was raised to 415° C in an atmosphere of forming gas ($H_2$-$N_2$) and held at that temperature for 2-3 minutes. The overall residence time in the oven was approximately 10 minutes. The device should remain at a temperature at which the transition layer is liquid for at least 1 minute to permit the various diffusion limited reactions to take place. The wafer was diced and further processed to produce electroluminescent diodes. Measurement of these diodes repeatedly showed a nearly 100 percent yield of diodes with a 2-3 ohm contact resistance for the approximately 3000 device from a single wafer. The thickness of gold was selected such that the tin-gold binary consisted of less than 10 weight percent tin, which is within the solid solution region of the tin-gold binary system.

For p-type materials beryllium-aluminum transition layers with less than 1 weight percent beryllium are liquid above 660° C and zinc-aluminum transition layers with 70-80 percent zinc are liquid above approximately 400° C. The diffusion of substrate elements into the transition layer may reduce the melting temperature of the layer so that the heat treatment may take place somewhat below the liquidus temperature of the transition layer binary alloy.

The following are exemplary layer thicknesses and heat treatment temperatures used to produce ohmic contact to $Ga_{1-x}Al_xAs$ ($x$ approximately 0.3 at the surface being contacted):

I Al-Sn-Au systems heat treated at temperatures from 375° C to 500° C

A. 60 Angstroms Al; 1,000 Angstroms Sn; 10,000 Angstroms Au
B. 60 Angstroms Al; 500 Angstroms Sn; 30,000 Angstroms Au
C. 30 Angstroms Al; 500 Angstroms Sn; 30,000 Angstroms Au
D. 30 Angstroms Al; 400 Angstroms Sn; 30,000 Angstroms Au
E. 30 Angstroms Al; 200 Angstroms Sn; 30,000 Angstroms Au
F. 30 Angstroms Al; 100 Angstroms Sn; 30,000 Angstroms Au II Al-Ge-Au systems heat treated at temperatures from 400° C to 600° C A. 50 Angstroms Al; 500 Angstroms Ge; 8,000 Angstroms Au
B. 100 Angstroms Al; 1000 Angstroms Ge; 2,000 Angstroms Au
C. 90 Angstroms Al; 865 Angstroms Ge; 2,300 Angstroms Au
D. 60 Angstroms Al; 865 Angstroms Ge; 2,300 Angstroms Au III Al-Si-Au system heat treated at temperatures from 400° C to 600° C.

A. 60 Angstroms Al; 1000 Angstroms Si; 10,000 Angstroms Au

What is claimed is:

1. Method for making ohmic contact to a semiconductor body including a surface layer at least one micrometer thick consisting primarily of an aluminum-containing compound semiconductor, comprising
   a. depositing a transition layer of aluminum and at least one shallow dopant element on the body
   b. depositing a layer of gold over and in contact with the transition layer and then
   c. heating the body with said transition and gold layers thereon in a nonoxidizing atmosphere to a temperature above the temperature at which the transition layer is liquid and below the melting temperature of gold.
2. Method of claim 1 in which the constituents of the transition layer are deposited as successvie layers.
3. Method of claim 2 in which the aluminum is deposited first.
4. Method of claim 1 in which the body is n-type and the shallow dopant element is tin, germanium or silicon.
5. Method of claim 4 in which the body is gallium aluminum arsenide and the shallow dopant is tin.
6. Method of claim 1 in which the body is p-type and the shallow dopant is beryllium or zinc.
7. A method of claim 1 including the further step of applying an external contact to the gold layer.
8. A device made by the method of claim 7.

* * * * *